(12) United States Patent
Yamakawa et al.

(10) Patent No.: US 7,208,982 B2
(45) Date of Patent: Apr. 24, 2007

(54) SAMPLING CIRCUIT

(75) Inventors: Masahiro Yamakawa, Tokyo (JP);
Yoshiharu Umemura, Tokyo (JP);
Toshiaki Awaji, Tokyo (JP); Satoshi Shiwa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/271,132

(22) Filed: Nov. 10, 2005

(65) Prior Publication Data

US 2006/0097898 A1 May 11, 2006

(30) Foreign Application Priority Data

Nov. 11, 2004 (JP) ............... 2004-328262

(51) Int. Cl.
*G11C 27/02* (2006.01)
(52) U.S. Cl. ...................................... 327/92
(58) Field of Classification Search ............ 327/91–94; 341/122
See application file for complete search history.

(56) References Cited

U.S. PATENT DOCUMENTS

| | | | |
|---|---|---|---|
| 5,179,565 A * | 1/1993 | Tsuchiya et al. | 372/38.06 |
| 2005/0194960 A1* | 9/2005 | Tayrani | 324/76.77 |
| 2005/0264105 A1* | 12/2005 | Kawata | 307/106 |

FOREIGN PATENT DOCUMENTS

| | | |
|---|---|---|
| JP | 5-63447 | 3/1993 |
| JP | 10-112636 | 4/1998 |
| JP | 2004-179912 | 6/2004 |

OTHER PUBLICATIONS

Patent Abstracts of Japan, Publication No.: 2004-179912, Publication Date: Jun. 24, 2004, 2 pages.
International Search Report issued for International application No. PCT/JP2005/019806 mailed on Nov. 22, 2005, 2 pages.

* cited by examiner

*Primary Examiner*—My-Trang Nu Ton
(74) *Attorney, Agent, or Firm*—Osha-Liang LLP

(57) ABSTRACT

A sampling circuit for compensating the phase difference of a sampling pulse due to a temperature variation to accurately sample input signals is provided. The sampling circuit samples received input signals. The sampling circuit includes a pulse generator for generating a pulse signal according to a timing at which an input signal should be sampled, a step recovery diode for outputting a sampling pulse responsive to the pulse signal, a detector for detecting the value for the input signal according to the sampling pulse, a temperature detecting circuit for detecting the temperature around the step recovery diode and a temperature compensating unit for controlling a timing at which the step recovery diode outputs the sampling pulse based on the temperature detected by the temperature detecting circuit.

6 Claims, 4 Drawing Sheets

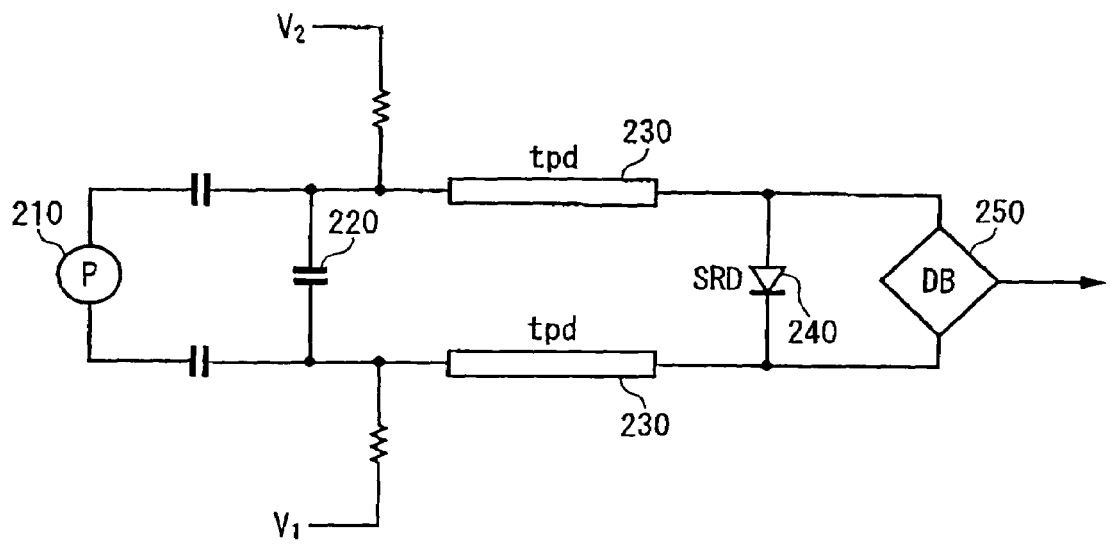
FIG. 5
(Conventional)

SAMPLING CIRCUIT

CROSS REFERENCE TO RELATED APPLICATION

The present application claims priority from a Japanese Patent Application No. JP 2004-328262 filed on Nov. 11, 2004, the contents of which are incorporated herein by reference.

BACKGROUND OF THE INVENTION

1. Field of the Invention

The present invention relates to a sampling circuit for sampling received input signals, Particularly, relates to a sampling circuit for generating sampling pulses using a step recovery diode.

2. Related Art

Generally, a circuit using SRD (step recovery diode) is known as a circuit for sampling input signals as disclosed, for example, in Japanese Patent Unexamined Publication No. 2004-179912. The circuit generates sampling pulses using the SRD and samples input signals by such as a diode bridge.

FIG. 5 shows an example of the configuration of a conventional sampling circuit 200. The sampling circuit 200 includes a pulse generator 210, a capacitor 220, a transmission path 230, a SRD 240 and a diode bridge 250.

The pulse generator 210 generates pulse signals according to a timing at which an input signal should be sampled. The SRD 240 receives the pulse signal and generates a sampling pulse based on the received pulse signal. The diode bridge 250 samples the input signal at the timing of the sampling pulse.

The pulse signal generated by the pulse generator 210 is applied to the SRD 240 through the transmission path 230 with an amount of delay tpd. The pulse signal arrived at the SRD 240 is reflected therefrom and arrives at the capacitor 220 through the transmission path 230. The pulse signal arrived at the capacitor 220 is inversed and reflected therefrom and is applied to the SRD 240 through the transmission path 230. Thus, the pulse signal and the inverted signal thereof, which is delayed from the pulse signal for 2tpd are applied to the SRD 240. Based on the composite wave of the pulse signal and the inverted signal, the SRD 240 generates a sampling pulse with the pulse width corresponding to the delay time 2tpd through the transmission path 230.

The timing at which the SRD outputs a sampling pulse is dependent on the temperature of the SRD in general. Therefore, the period during which the SRD 240 receives a sampling signal and outputs a sampling pulse is dependent on the temperature of the SRD 240. The reason is that the period during which the SRD 240 receives a sampling signal and outputs a sampling pulse is determined based on a storage time ts (a time for which a reverse current is applied), and the storage time is dependent on the temperature of the SRD 240.

Here, the temperature of the SRD 240 is varied with such as a frequency of operation and ambient environment. Therefore, an error of the timing at which the SRD outputs a sampling pulse has been occurred in the conventional sampling circuit, and it has been difficult that input signals are accurately sampled.

SUMMARY OF THE INVENTION

Thus, the object of the present invention is to provide a sampling circuit being capable of solving the above-described problem. This object is achieved by combining the features recited in independent claims. Then, dependent claims define further effective specific examples of the present invention.

To solve the above-described problem, a sampling circuit for sampling received input signals is provided in embodiments of the present invention. The sampling circuit includes a pulse generator for generating pulse signals according to a timing at which an input signal should be sampled, a step recovery diode for outputting a sampling pulse responsive to the pulse signal, a detector for detecting the value for the input signal according to the sampling pulse, a temperature detecting circuit for detecting the temperature around the step recovery diode and a temperature compensating unit for controlling a timing at which the step recovery diode outputs the sampling pulse based on the temperature detected by the temperature detecting circuit.

The temperature compensating unit may control a bias voltage applied to the step recovery diode based on the temperature detected by the temperature detecting circuit. The temperature compensating unit may decrease the bias voltage applied to the step recovery diode when the temperature detected by the temperature detecting circuit is increased, and increase the bias voltage applied to the step recovery diode when the temperature detected by the temperature detecting circuit is decreased.

The temperature compensating unit may previously store a temperature table indicating a relationship between the temperature of the step recovery diode and a phase of the sampling pulse outputted from the step recovery diode, and a bias table indicating a relationship between the bias voltage applied to the step recovery diode and the phase of the sampling pulse outputted from the step recovery diode.

A cathode terminal of the step recovery diode may be contacted to ground. One end of the sampling circuit may be connected to the pulse generator and the other end of that is connected to an anode terminal of the step recovery diode. The sampling circuit may further include a transmission path having a constant delay time and a capacitor provided between one end of the transmission path and a ground potential.

The sampling circuit may further include a transformer for transmitting the sampling pulse to the detector. The detector may have a diode bridge for detecting the value for the input signal based on the non-inverting output and the inverting output of the transformer as a sampling pulse.

Here, all necessary features of the present invention are not listed in the summary of the invention. The sub-combinations of the features may become the invention.

BRIEF DESCRIPTION OF THE DRAWINGS

FIG. 2 shows each example of waveforms of a pulse signal inputted into a SRD 26 and a sampling pulse outputted from the SRD 26.

FIG. 3 is an explanatory diagram of an operation of a control unit 20.

FIG. 5 shows an example of a Conventional sampling circuit 200.

DETAILED DESCRIPTION OF THE INVENTION

Hereinafter, the present invention will now be described through referred embodiments. The embodiments do not limit the invention according to claims and all combinations of the features described in the embodiments are not necessarily essential to means for solving the problems of the invention.

Figure 1:
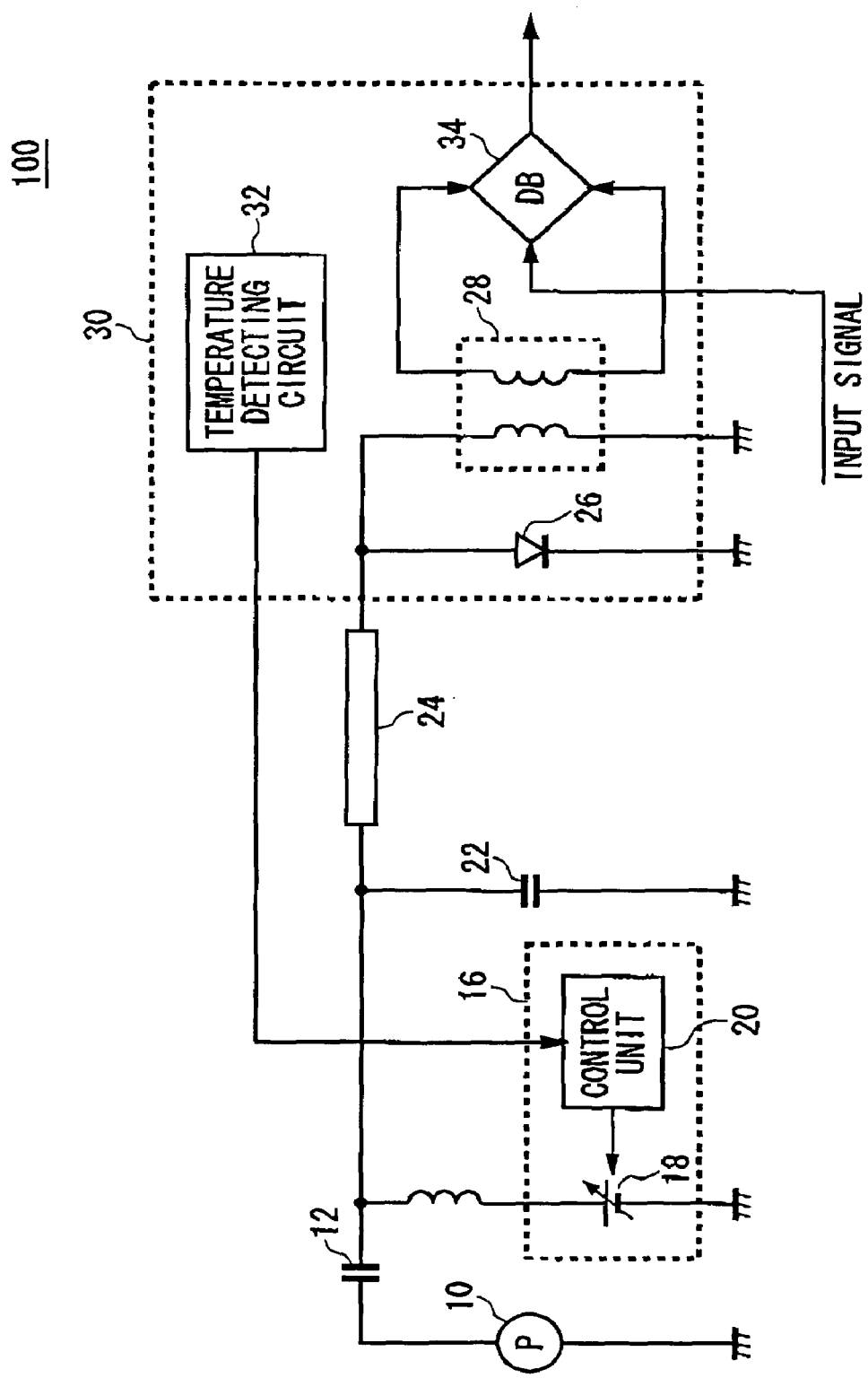
FIG. 1 shows an example of the configuration of a sampling circuit 100 according to an embodiment of the he present invention.

FIG. 1 shows an example of the configuration of a sampling circuit 100 according to an embodiment of the present invention. The sampling circuit 100 samples received input signals. The sampling circuit 100 includes a pulse generator 10, a capacitor 12, a temperature compensating unit 16, a capacitor 22, a transmission path 24 and a sampling head 30.

The pulse generator 10 generates pulse signals according to a timing at which an input signal should be sampled. The capacitor 12 passes through the high frequency component of the signal outputted from the pulse generator 10. That is to say, the capacitor 12 removes the dc component outputted from the pulse generator 10 and passes through the pulse component.

One end of the transmission path 24 is connected to the capacitor 12 and the other end of that is connected to the sampling head 30. Therefore, the transmission path 24 receives the pulse signal generated by the pulse generator 10 and provides the same to the sampling head 30. The transmission path 24 has a transmission delay time tpd. Therefore, the transmission path 24 provides the pulse signal to the sampling head with the delay time tpd.

The capacitor 22 is provided between one end of the transmission path connected to the capacitor 12 and a ground potential. The pulse signal provided from the transmission path 24 to the sampling head 30 is reflected on the anode terminal of a step recovery diode (SRD) 26 and inputted into the capacitor 22 through the transmission path 24. At this time, the pulse signal is inversed and reflected on the capacitor 22, and provided to the sampling head 30 through the transmission path 24. Therefore, a composite wave of the pulse signal and the inverted signal thereof with delay time 21 tpd is provided to the sampling head 30.

The sampling head 30 includes the SRD 26, a transformer 28, a detector 34 and a temperature detecting circuit 32. The SRD 26 generates a sampling pulse based on the above-described composite wave and outputs the same.

The detector 34 has such as a diode bridge circuit and detects the value for the received input signal responsive to the received sampling pulse. The transformer 28 transmits the sampling pulse outputted from the SRD 26 to the detector 34. In the present embodiment, the detector 34 includes a diode bridge circuit for detecting the value for the input signal based on the non-inverting output and the inverting output of the transformer 28 as a sampling pulse.

The temperature detecting circuit 32 is provided close to the SRD 26 and detects the temperature around the SRD 26. The temperature detecting circuit 32 may include elements having a temperature-dependent characteristic. The temperature detecting circuit 32 includes such as a diode, a SRD and a thermistor. If the temperature detecting circuit 32 has the diode and the SRD, the diode or SRD is provided close to the SRD 26 and detects the forward voltage of the diode or SRD to detect a temperature.

The temperature compensating unit 16 controls a timing at which the SRD 26 outputs a sampling pulse based on the temperature detected by the temperature detecting circuit 32. In the present embodiment, the temperature compensating unit 16 controls the timing of a sampling pulse by controlling the bias voltage applied to the SRD 26. However, the timing of a sampling pulse may be controlled by the other methods. For example, the timing of a sampling pulse may be controlled by controlling the phase of the pulse signal applied to the SRD 26.

The temperature compensating unit 16 includes a power supply 18 and a control unit 20. The power supply 18 applies a bias voltage to the SRD 26. In the present embodiment, the cathode terminal of the SRD 26 is contacted to ground and the power supply 18 applies a bias voltage to the anode terminal of the SRD 26 through the transmission path 24.

The control unit 20 controls the bias voltage generated by the power supply 18 based on the temperature detected by the temperature detecting circuit 32. The timing at which the SRD 26 outputs a sampling pulse is varied with the applied bias voltage. Therefore, the control unit 20 controls the bias voltage generated by the power supply 18 based on the temperature variation in order to compensate the difference of the timing at which a sampling pulse is outputted, which is caused by the temperature variation. For example, the control unit 20 decreases the bias voltage generated by the power supply 18 when the temperature detected by the temperature detecting circuit 32 is increased, and increases the bias voltage generated by the power supply 18 when the temperature detected by the temperature detecting circuit 32 is decreased.

According to the above-described configuration, the difference of the timing at which a sampling pulse is outputted, which is caused by the temperature variation can be compensated. Therefore, input signals can be accurately sampled.

Figure 2A:
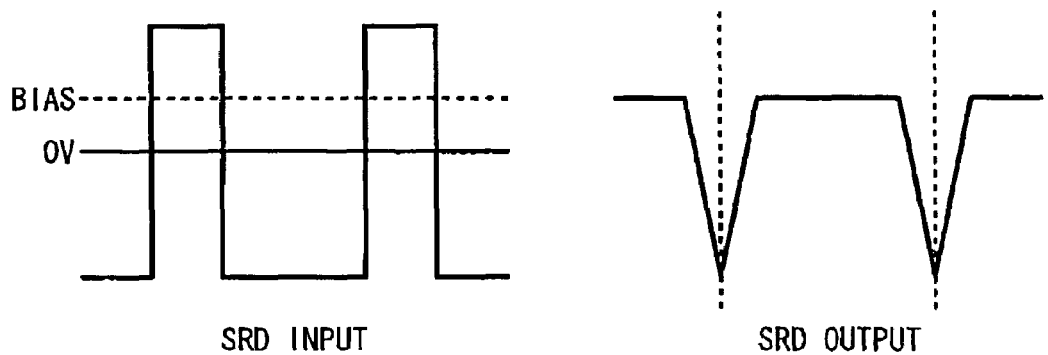
FIG. 2A shows a waveform when a temperature is not varied.
Figure 2B:
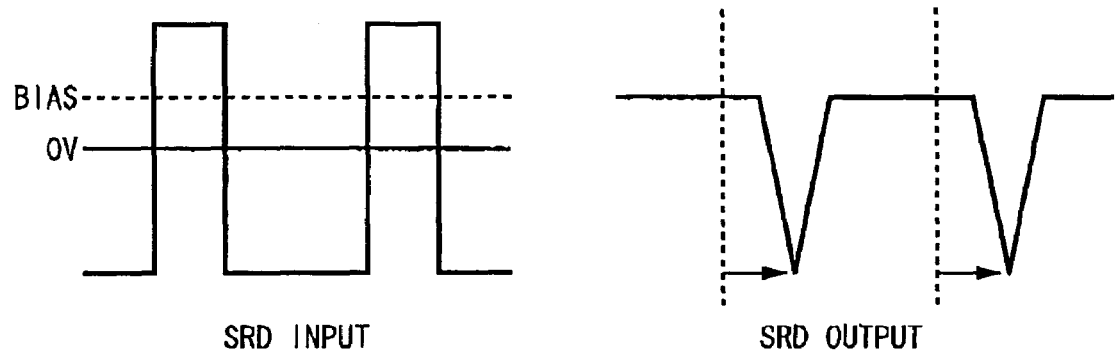
FIG. 2B shows a waveform when a temperature is varied.
Figure 2C:
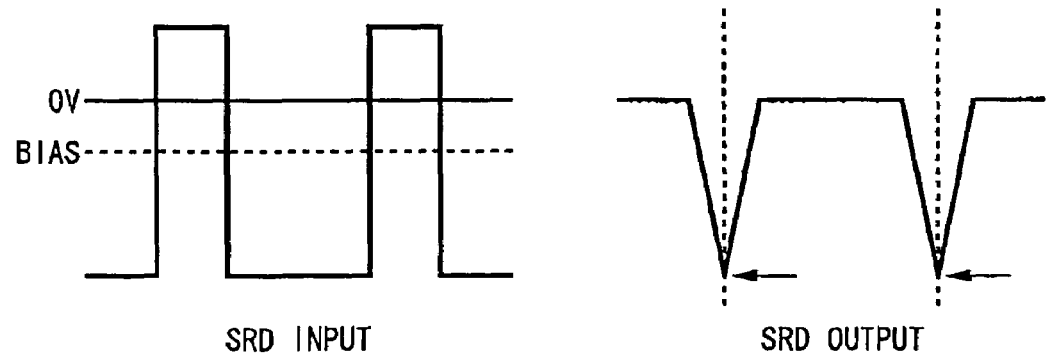
FIG. 2C shows a waveform when a temperature is varied while a bias voltage is controlled.

FIG. 2 shows each example of waveforms of a pulse signal inputted into the SRD 26 and a sampling pulse outputted from the SRD 26. FIG. 2A shows a waveform when a temperature is not varied. FIG. 2B shows a waveform when a temperature is varied. FIG. 2C shows a waveform when a temperature is varied while a bias voltage is controlled.

As shown in FIG. 2B, when the temperature of the SRD 26 is varied, the phase of the sampling pulse is shifted in contrast with when the temperature is not varied. The control unit 20 calculates the phase difference based on the temperature detected by the temperature detecting circuit 32. Then, the control unit 20 controls the bias voltage generated by the power supply 18 to compensate the calculated phase difference. Thereby the phase difference of the sampling pulse due to the temperature variation can be compensated.

Figure 3A:
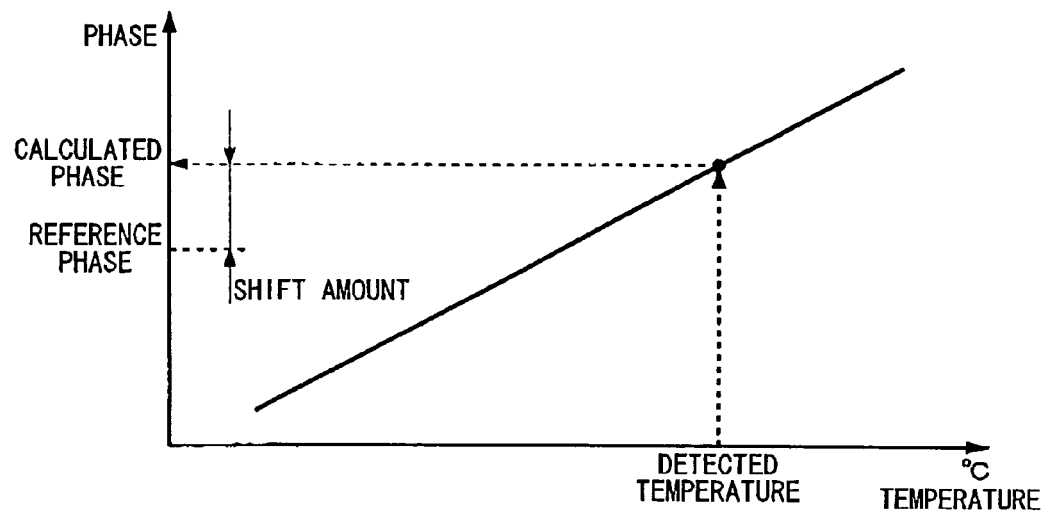
FIG. 3A shows a relationship between the temperature of the SRD 26 and the phase of the sampling pulse outputted from the SRD 26.
Figure 3B:
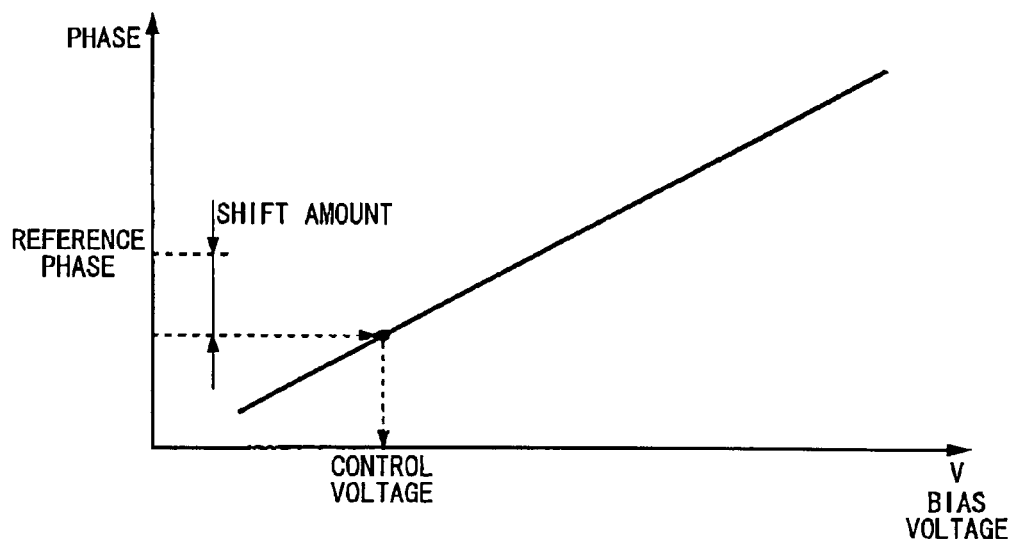
FIG. 3B shows a relationship between the bias voltage applied to the SRD 26 and the phase of the sampling pulse outputted from the SRD 26.

FIG. 3 is an explanatory diagram of an operation of a control unit 20. FIG. 3A shows a relationship between the temperature of the SRD 26 and the phase of the sampling pulse outputted from the SRD 26. FIG. 3B shows a relationship between the bias voltage applied to the SRD 26 and the phase of the sampling pulse outputted from the SRD 26. Preferably, the control unit 20 previously stores a temperature table indicating a relationship between the temperature of the SRD 26 and the phase of the sampling pulse outputted from the SRD 26, and a bias table indicating a relationship between the bias voltage applied to the SRD 26 and the phase of the sampling pulse outputted from the SRD 26.

In the temperature table, the control unit 20 detects the phase of the sampling pulse corresponding to the temperature detected by the temperature detecting circuit 32 and calculates the shift amount of the phase of the sampling pulse at the detected temperature. Then, in the bias table, the control unit 20 detects the bias voltage to compensate the calculated shift amount and controls the bias voltage generated by the power supply 18.

As shown in FIGS. 3A and 3B, when the above-described relationships are liner, the temperature of the SRD 26 and the bias voltage most appropriate to compensate the shift amount of the phase at the temperature are uniquely determined. The control unit 20 may previously store the relationship between the detected temperature of the SRD 26 and the bias voltage most appropriate to compensate the shift amount of the phase of the sampling pulse at the detected temperature.

The control unit 20 may also generate the temperature table and the bias table and store the same. In this case, the control unit 20 includes means for measuring the phase of a sampling pulse. Then, the control unit 20 may produce the temperature table by measuring the phase of the sampling pulse for each temperature, and produce the bias table by measuring the phase of the sampling pulse for each bias voltage. Thereby the phase of the sampling pulse can be accurately compensated even if the property of the SRD 26 varies.

The temperature detecting circuit 32 may notify the control unit 20 of the property value for such as a forward voltage measured by the diode and the SRD. Here, the control unit 20 calculates the temperature of the SRD based on the property value. At this time, it is preferred that the relationship between the property value and the temperature is previously provided to the control 20.

Figure 4:
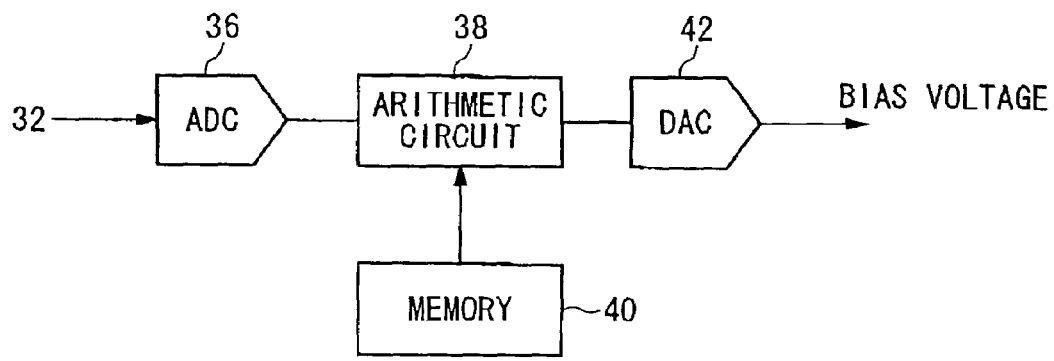
FIG. 4 shows an another example of the configuration of a temperature compensating part 16.

FIG. 4 shows another example of the configuration of the temperature compensating unit 16. The temperature compensating unit 16 includes an analog-digital converter (ADC) 36, an arithmetic circuit 38, a memory 40 and a digital-analog converter(DAC) 42. In the present embodiment, the temperature compensating unit 16 receives the property value for such as a forward voltage measured by the temperature detecting circuit 32.

The ADC 36 converts the received property value to digital data. The arithmetic circuit 38 calculates the bias voltage to be applied to the SRD 26 based on the digital data. The memory 40 previously stores information indicative of the relationship between the property value and the bias voltage.

The memory 40, for example, previously stores the relationship between the property value and the temperature of the SRD 26, the relationship between the temperature of the SRD 26 and the shift amount of the phase of the sampling pulse and the relationship between the shift amount of the phase of the sampling pulse and the bias voltage. The arithmetic circuit 38 detects the bias voltage corresponding to the received property value based on the those relationships.

The memory 40 may previously store a correction function to calculate the inverse property of the property value when the received property value is non-linear. The arithmetic circuit 38 corrects the property value by the correction function to uniquely determine the relationship between the bias voltage to be applied to the SRD 26 and the property value.

The DAC 42 generates a voltage corresponding to the bias voltage value calculated by the arithmetic circuit 38 and applies the same to the SRD 26. According to the above-described configuration, the bias voltage according to the detected temperature variation is applied to the SRD 26 so that the phase difference of the sampling pulse can be compensated.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

For example, the sampling circuit 100 may be used with a test apparatus such as a semiconductor circuit. In this case, the test apparatus includes a pattern producing unit for producing a test pattern which tests a circuit under test, an waveform forming unit for generating a test signal according to the test pattern and a determination unit for determining whether the circuit under test is good or bad based on the output signal outputted from the circuit under test. The determination unit has the sampling circuit 100 to sample the output signal and determines whether the circuit under test is good or bad by comparing the sampling data of the output signal with the expected value data provided by the pattern producing unit. By using such test apparatus, output signals can be accurately sampled so that it can be accurately determined whether the circuit under test is good or bad.

As thus described above according to the sampling circuit of the present invention, the phase difference of the sampling pulse due to the temperature variation is compensated so that input signals can be accurately sampled.

What is claimed is:

1. A sampling circuit for sampling a received input signal, comprising:
    a pulse generator for generating a pulse signal according to a timing at which the input signal should be sampled;
    a step recovery diode for outputting a sampling pulse responsive to the pulse signal;
    a detector for detecting the value for the input signal responsive to the sampling pulse;
    a temperature detecting circuit for detecting the temperature around the step recovery diode; and
    a temperature compensating unit for controlling a timing at which the step recovery diode outputs the sampling pulse.

2. The sampling circuit according to claim 1, wherein the temperature compensating unit controls a bias voltage applied to the step recovery diode based on the temperature detected by the temperature detecting circuit.

3. The sampling circuit according to claim 2, wherein the temperature compensating unit decreases the bias voltage applied to the step recovery diode when the temperature detected by the temperature detecting circuit is increased, and increases the bias voltage applied to the step recovery diode when the temperature detected by the temperature detecting circuit is decreased.

4. The sampling circuit according to claim 2, wherein the temperature compensating unit previously stores a temperature table indicating a relationship between the temperature of the step recovery diode and a phase of the sampling pulse outputted from the step recovery diode, and a bias table indicating a relationship between the bias voltage applied to the step recovery diode and the phase of the sampling pulse outputted from the step recovery diode.

5. The sampling circuit according to claim 2, wherein a cathode terminal of the step recovery diode is connected to ground and wherein the sampling circuit further comprising:
a transmission path of which one end is connected to the pulse generator and of which the other end connected to an anode terminal of the step recovery diode and having a certain delay time;
a capacitor provided between the one end of the transmission path and a ground potential.

6. The sampling circuit according to claim 5 further comprising a transformer for transmitting the sampling pulse to the detector, wherein the detector having a diode bridge for detecting the value for the input signal based on the non-inverting output and the inverting output of the transformer as a sampling pulse.

* * * * *